(12) United States Patent
Kikawa et al.

(10) Patent No.: US 6,576,503 B2
(45) Date of Patent: Jun. 10, 2003

(54) LASER DIODES AND MANUFACTURING METHODS

(75) Inventors: Takeshi Kikawa, Kodaira (JP); Shigeo Goto, Tokorozawa (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/902,778

(22) Filed: Jul. 12, 2001

(65) Prior Publication Data

US 2002/0042157 A1 Apr. 11, 2002

(30) Foreign Application Priority Data

Oct. 6, 2000 (JP) .................................... 2000-307385

(51) Int. Cl.[7] .................... H01C 21/44; H01L 21/20
(52) U.S. Cl. .................. 438/152; 438/158; 438/166; 438/184
(58) Field of Search ................. 372/49; 438/151, 438/152, 167, 168, 184, 166, 158

(56) References Cited

U.S. PATENT DOCUMENTS

| | | | | |
|---|---|---|---|---|
| 4,337,443 A | * | 6/1982 | Umeda et al. ............... 372/49 |
| 5,228,047 A | * | 7/1993 | Matsumoto et al. .......... 372/45 |
| 6,345,064 B1 | * | 2/2002 | Fujii ........................... 372/46 |
| 6,370,177 B1 | * | 4/2002 | Genei et al. .................. 372/49 |
| 6,400,743 B1 | * | 6/2002 | Fukunaga et al. ............ 372/46 |
| 6,516,016 B1 | * | 2/2003 | Fukunaga et al. ............ 372/45 |
| 6,529,537 | * | 3/2003 | Yamanaka ................... 372/49 |

OTHER PUBLICATIONS

Passlack et al. "Infrared Microscopy Studies of High–Power InGaAs–GaAs–InGaP Lasers with Ga2O3 Facet Coatings," IEEE Journal of Selected Topics In Quantum Electronics, vol. 1 No. 2, Jun. 1995, pp. 110–116.*

"Facet protection of (AlGa)As lasers using $SIO^2$ sputter deposition," Yuasa et al., Appl. Phys. Lett. 34(10), May 15, 1979, pp. 685–687.

* cited by examiner

Primary Examiner—Michael S. Lebentritt

(57) ABSTRACT

A laser diode having an optical cavity which is formed on top of a semiconductor substrate and has semiconductor crystals and an oxide layer that is substantially free from arsenic oxide. The oxide layer may be formed by using the matrix of the optical cavity as a matrix or a layer formed by the hydrogenation or oxygenation of the matrix of the cavity on at least one side of the optical cavity. The laser diode has a long operational life and high reliability without facet degradation.

4 Claims, 7 Drawing Sheets

LASER DIODES AND MANUFACTURING METHODS

PRIORITY TO FOREIGN APPLICATIONS

This application claims priority to Japanese Patent Application No. P2000-307385.

BACKGROUND OF THE INVENTION

1. Field of the Invention

The present invention relates to laser diodes, and more particularly, relates to laser diodes having an oscillation wavelength of at least 600 nm and manufacturing techniques therefor.

2. Description of the Background

High-output and high-reliability laser diodes for use in an excitation source for an optical amplifier are used frequently in devices for writing an optical or optomagnetic disk and in optical communication systems. These laser diodes are typically required to operate stably in a fundamental mode for an extended period of time. A insulation coating film may be formed on the surface of a semiconductor as the radiation facet of a laser diode. This process may improve the external differential quantum efficiency by obtaining appropriate reflectance and may prevent a reduction in the peak output caused by an increase in threshold carrier density.

Previous examples of this coating film used in lasers include a silicon oxide thin film formed on one side of a cavity as an antireflection film with a layered film consisting of a silicon oxide thin film and a hydrogenated amorphous silicon thin film formed on the other side of the cavity as a high reflection film. Examples of the coating film are reported by, for example, T. Uasa in Applied Physics Letters, vol. 1, 34, pp. 685).

The antireflection coating film conventionally used in many semiconductor lasers is a silicon oxide, silicon nitride or aluminum oxide single-layer film, or a layered film consisting of a silicon oxide film and a silicon nitride film. These films are designed to achieve a predetermined reflectance value. However, in the case of a high-output laser having an oscillation wavelength of at least 600 nm and a radiation density of several $MW/cm^2$, upon continuous wave operation under auto-power control, the facet degradation of the cavity by optical damage is promoted with the passage of operation time, whereby the laser ceases to oscillate.

The degradation of the radiation facet is caused by a non-radiative recombination center due to a surface state or a defect which occurs on the facet at the time of forming the coating film. When oscillation light is absorbed at the non-radiative recombination center, heat is generated and the temperature of the radiation facet rises. The multiplication of the non-radiative recombination center and a reduction in the energy gap of a forbidden band in the vicinity of the facet occur by heat generation. Thereby, light absorption grows and the temperature of the facet rises further. This may cause the facet to melt or become amorphous, resulting in the irreversible destruction of a laser diode.

SUMMARY OF THE INVENTION

In at least one embodiment, the present invention preferably provides a laser diode which has a long service life and high reliability and a method for manufacturing the same.

As will be described in detail below, the present invention may be used in a high-output laser comprising a GaAs substrate having a radiation density of at least several $MW/cm^2$ and an oscillation wavelength of at least approximately 600 nm. According to at least one presently preferred embodiment of the invention, there is provided a laser diode which can be easily manufactured and has a long service life and high reliability with a small increase in the operation current after the laser has been in operation for an extended period of time.

The main aspects of the present invention are as follows. According to a first aspect of the present invention, there is provided a laser diode which has an optical cavity comprised of semiconductor crystals formed on top of a semiconductor substrate and an oxide layer that is substantially free from arsenic oxide formed on at least one side of the optical cavity using the matrix of the cavity as the matrix of the oxide layer (i.e., the main material comprising the optical cavity is the material used for the oxide layer). Herein, the term "substantially free from arsenic oxide" is characterized by a preferred state wherein the oxide layer is totally free from arsenic oxide but, because of imperfections in the manufacturing or other process, this term also includes a minute or trace amount of arsenic oxide in the oxide layer.

According to another aspect of the present invention, there is provided a laser diode which has an optical cavity comprised of semiconductor crystals formed on the top of a semiconductor substrate and which has an oxide region that is substantially free from arsenic oxide and that is continuous to the crystals of the matrix of the cavity with respect to crystallography on at least one side of the optical cavity.

According to another aspect of the present invention, there is provided a laser diode which has an optical cavity comprised of compound semiconductor crystals in the III–V family formed on the top of a semiconductor substrate and which has a layer formed by the hydrogenation and oxygenation of the matrix of the cavity on at least one side of the optical cavity.

According to another aspect of the present invention, there is provided a laser diode which has an insulating film made from a different material from the oxide layer which is substantially free from arsenic oxide.

According to another aspect of the present invention, there is provided a laser diode which has an insulating layer made from a different material from a second layer which is substantially free from arsenic oxide, said second layer formed by the hydrogenation and oxygenation of the matrix of the cavity.

The oxide layer that is substantially free from arsenic oxide or the layer formed by the hydrogenation and oxygenation of the matrix of the cavity of the present invention can be formed on both facets of the optical cavity.

According to another aspect of the present invention, there is provided a laser diode, wherein an optical cavity having semiconductor crystals is formed on top of a semiconductor substrate, and at least one side of the optical cavity has a light reflective surface in the interior of the matrix of the cavity.

That is, in the present invention, the matrix of the optical cavity extends and a light reflective surface is formed in the oxide layer that is substantially free from arsenic oxide or a layer formed by the hydrogenation and oxygenation of the matrix of the optical cavity. In the above laser diode, an area having a light reflective surface in the interior of the matrix of the cavity on at least one side of the optical cavity can be formed on both facets of the optical cavity.

The method of manufacturing a laser diode of the present invention will now be described. According to another aspect of the present invention, there is provided a method of manufacturing a laser diode comprising the step of preparing an optical cavity having compound semiconductor crystals in the III–V family formed on top of a substrate and the step of irradiating the radiation surface of the optical cavity with hydrogen and oxygen.

The present invention may be effective when the hydrogen is excited to an atomic, radical, ion or mixed state thereof and the oxygen is excited to an atomic, radical, ion, ozone or mixed state thereof. The above hydrogen and the above oxygen may be irradiated alternately or at the same time.

The laser diode of the present invention may be used as a compound laser diode having an oscillation wavelength of 600 nm or more. It may also be used as a compound laser diode having an optical output of $1 \times 10^6$ W/cm$^2$ or more.

BRIEF DESCRIPTION OF THE DRAWINGS

For the present invention to be clearly understood and readily practiced, the present invention will be described in conjunction with the following figures, wherein like reference characters designate the same or similar elements, which figures are incorporated into and constitute a part of the specification, wherein.

DETAILED DESCRIPTION OF THE INVENTION

Figure 1:
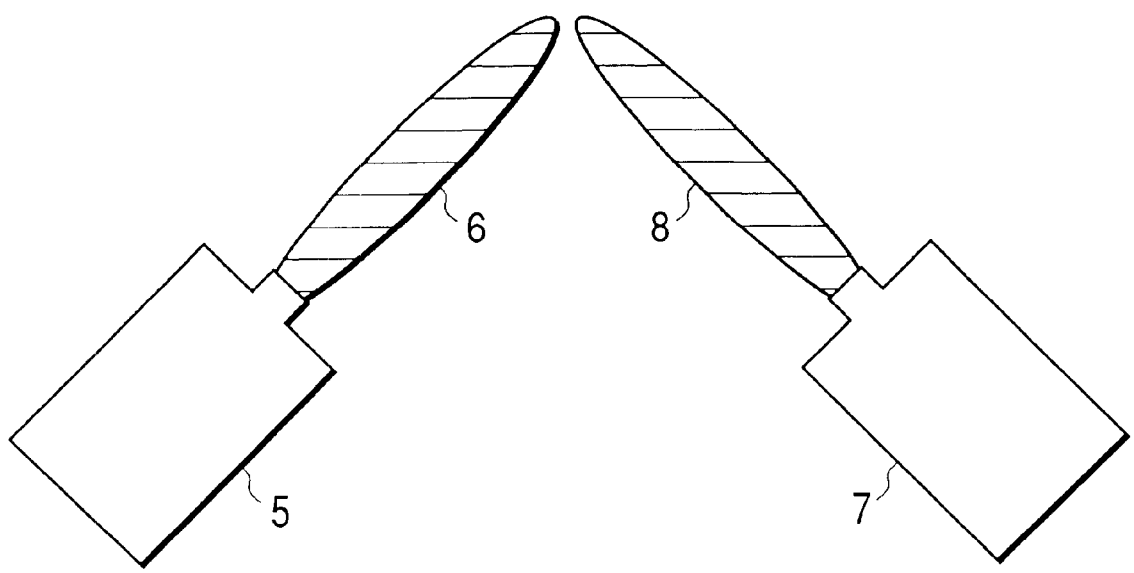
FIG. 1 is a conceptual diagram showing a surface treating method for forming an interfacial layer on a facet according to the present invention.

It is to be understood that the figures and descriptions of the present invention have been simplified to illustrate elements that are relevant for a clear understanding of the present invention, while eliminating, for purposes of clarity, other elements that may be well known. Those of ordinary skill in the art will recognize that other elements are desirable and/or required in order to implement the present invention. However, because such elements are well known in the art, and because they do not facilitate a better understanding of the present invention, a discussion of such elements is not provided herein. The detailed description will be provided hereinbelow with reference to the attached drawings.

Prior to a detailed description of several preferred embodiments of the present invention, items related to the embodiments of the present invention will be described in more detail. One or more of the above problems are addressed by irradiating the cleaved facet with oxygen and hydrogen under vacuum immediately before the formation of a coating film on the facet of the optical cavity.

In the present invention, the radicals of oxygen and hydrogen may play a major role. The matrix element of the facet of the above optical cavity is oxidized by the irradiation of the oxygen radical, and the contamination of the above facet by organic substances including adhered carbon is preferably eliminated by this oxidation. Further, an oxide having a group V element such as As is reduced and comes off from the surface by the irradiation of the hydrogen radical.

When the oxidation of the matrix element is carried out by the irradiation of oxygen, a large amount of As oxide is formed, and high-density surface states are created. When this surface is coated, non-radiative recombination centers are formed at a high density, and facet degradation is sharply promoted. However, the As oxide has a higher steam pressure and is more easily reduced than the oxide of the group III element such as Ga (gallium). Thereafter, when the surface of the semiconductor which has been irradiated with the oxygen radical is irradiated with the appropriate hydrogen radical, the oxide of the group III element is not reduced and only the As oxide is reduced and separated from the surface.

By this process, an interfacial layer which is essentially composed of Ga oxide and is substantially free from As oxide can be formed on the surface of the facet. Therefore, the interface between the semiconductor material and the insulating film is formed in the interior of the semiconductor region rather than the surface of the semiconductor region. Hydrogen invading into the semiconductor region preferably terminates an ionization energy level for a defect caused by a dangling bond, void, anti-site and impurity atom in the interior of the semiconductor region near the interface and reduces the number of the non-radiative recombination centers.

When a common coating film is formed after the As oxide is removed from the surface by the irradiation of hydrogen, an interface having a small number of surface states and a small number of non-radiative recombination centers is preferably obtained. Thus, a high-output laser diode which may rarely experience facet degradation is preferably obtained by using the above interfacial layer which is essentially composed of the oxide of the group III element such as Ga and is substantially free from the oxide of the group V element such as As.

FIG. 1 is a conceptual top view for explaining the surface treatment method of the present invention. An oxygen radical cell 5 and a hydrogen radical cell 7 are placed in a vacuum container 0 for the face treatment of a laser diode 1. Other vacuum-related units may be commonly used units. Reference numeral 1 denotes a laser diode, 2 the facet of a semiconductor region formed by the cleavage of a semiconductor crystal, 3 the interfacial layer (in the present invention, the interfacial layer is preferably made of an oxide and may be referred to herein as an "oxide layer"), and 4 the other facet of the optical cavity of the present invention.

FIG. 1 generally shows the oxygen radical beam 6 and the hydrogen radical beam 8. When the oxygen radical beam 6 and the hydrogen radical beam 8 are supplied alternately or simultaneously to the facet 2 of the compound semiconductor material as shown in FIG. 1, an interfacial layer 3 which is made from an oxide containing substantially no As oxide can be formed. When the compound semiconductor material is a compound semiconductor in the III–V family, particularly GaAs, an oxide, mainly Ga oxide, forms the above interfacial layer.

When a coating film which is an insulating film is formed on the above interfacial layer 3 by a sputtering method, chemical vapor deposition or electron beam deposition to adjust reflectance, a satisfactory facet coating film which is rarely damaged by deposition is preferably obtained.

According to the present invention, a problem such as the deterioration in the characteristic properties of an element over the period of operation time may be solved not only in a laser element for optical recording devices which oscillates light having a wavelength of 0.68 $\mu$m, 0.65 $\mu$m or 0.63 $\mu$m at an output of at least approximately 1 MW/cm$^2$ but also in a laser element which oscillates light having a wavelength of 0.98 $\mu$m at an output of at least approximately 2 MW/cm$^2$.

The present invention may be used for a high-output laser diode having an oscillation wavelength of at least approximately 600 nm in an optical information system and a high-output laser diode for use in an optical amplifier for light having a wavelength of approximately 980 nm in an optical communication system.

The present invention generally has an optical cavity having semiconductor crystals formed on top of a semiconductor substrate as described above. To construct a laser diode having an oscillation wavelength of at least 600 nm, particularly 600 to 980 nm, compound semiconductor materials in the III–V family, such as GaAs, InGaAs and AlGaAs, are typically used. Therefore, a compound semiconductor substrate, particularly a GaAs substrate, may be used as the substrate for mounting an optical cavity.

In the present invention, an oxide layer that is substantially free from As oxide is used. More specifically, an oxide layer without arsenic oxide made from an oxide of the group III element such as In, Ga or Al is formed on the light output surface of the optical cavity. The layer on the surface of the optical cavity preferably has a thickness of about 10 Å to 50 Å.

According to the present invention, a common facet coating film, AR (Anti-Reflection) film or HR (High-Reflection) film may be formed on top of the thus-obtained oxide layer or the layer formed by the hydrogenation or oxygenation of the matrix of the optical cavity. Further, a so-called "window structure," a region having a sufficient transmissivity for the oscillation wavelength, may be formed on the light radiation side of the optical cavity. That is, the oxide layer without arsenic oxide of the present invention or the layer formed by the hydrogenation or oxygenation of the matrix of the optical cavity is formed on the surface of this window structure.

The laser diode of the present invention may be used as a laser diode comprising a GaAs substrate. Specific applied examples of the laser diode include: (1) 0.98 $\mu$m lasers typified by excitation sources for rare earth, for example, erbium doped optical fiber amplifiers (EDFA); (2) 680 $\mu$m lasers typified by light sources for reading and writing MO disks; and (3) 650 $\mu$m lasers typified by light sources for reading and writing DVD-RAM.

Figure 2:
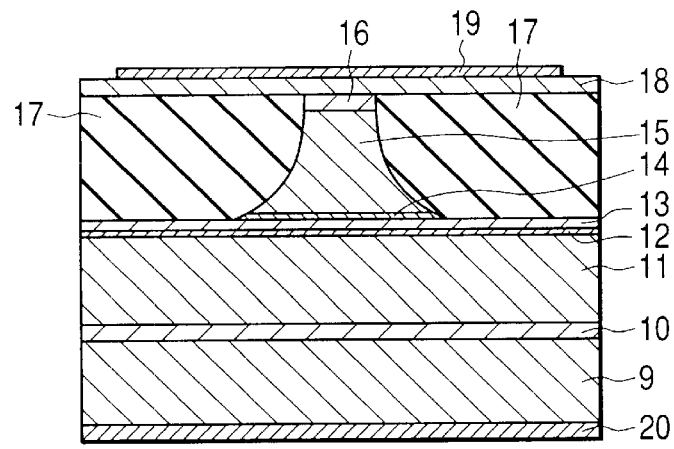
FIG. 2 is a sectional view in a direction perpendicular to the traveling direction of light of a laser diode according to a first exemplary embodiment of the present invention.
Figure 3:
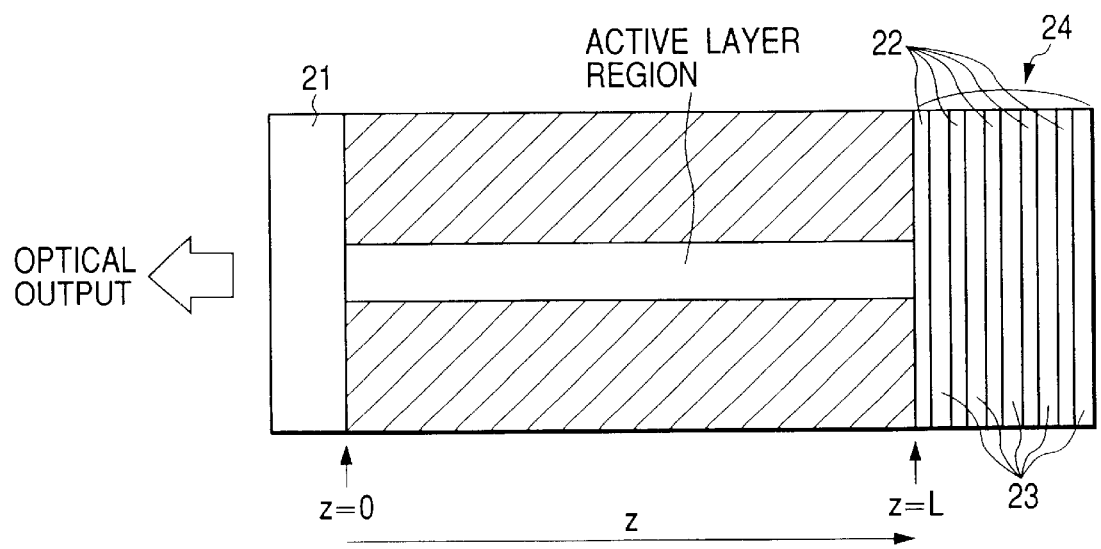
FIG. 3 is a plan view in a direction parallel to the traveling direction of light of the laser diode according to a first exemplary embodiment of the present invention.

Several exemplary embodiments of the present invention will now be described in detail. A first exemplary embodiment of the present invention will be explained with reference to FIGS. 1, 2 and 3. FIG. 1 shows a surface treatment method for the formation of an interfacial layer on a facet according to the present invention as described above. FIG. 2 is a sectional view in a direction perpendicular to the traveling direction of laser light of a laser diode ("LD") FIG. 3 is a plan view thereof.

This exemplary embodiment is an approximately 680 nm high-output laser diode used to write optical disks and optical magnetic disks. With reference to FIG. 2 and FIG. 3, this embodiment will be described based on the production process of this element.

The following layers are preferably formed on top of an n-GaAs substrate 9 sequentially. These layers may be formed using a conventional method such as MOVPE (Metal Organic Vapor Phase Epitaxy), CBE (Chemical Beam Epitaxy) or MBE (Molecular Beam Epitaxy): (1) a GaAs buffered layer 10; (2) GaAs lattice matched n-(Al$_x$Ga$_{1-x}$)-Inp cladding layer (x=0.7) 11; (3) strained quantum well layer 12 consisting of a GaAs lattice matched (Al$_y$Ga$_{1-y}$)InP barrier layer (y=0.45, barrier layer thickness of 4 nm), In$_z$Ga$_{1-z}$P strained quantum well layer (z=0.6, well layer thickness of 8 nm) and SCH (Separate Confinement Heterostructure) layer (s=0.55, barrier layer thickness of 4 nm) made from (Al$_s$Ga$_{1-s}$)InP; (4) GaAs lattice matched p-(Al$_t$Ga$_{1-t}$)InP cladding layer (t=0.7) 13; (5) etch stop layer 14 made from GaAs lattice matched p-InGaP; (6) GaAs lattice matched p-(Al$_u$Ga$_{1-u}$)InP cladding layer (u=0.7) 15; and (7) p-Al$_v$Ga$_{1-v}$As cap layer (v=0.7) 16.

A ridge as shown in FIG. 2 is preferably formed by photoetching the laminate consisting of the p-(Al$_u$Ga$_{1-u}$)InP cladding layer (u=0.7) 15 and the p-Al$_v$Ga$_{1-v}$As cap layer (v=0.7) 16 using the oxide film as a mask area. This etching may be wet etching, RIE (Reactive Ion Etching), RIBE (Reactive Ion Beam Etching), ion milling or a similar process. Etching is stopped at the etch stop layer 14 so that the strained quantum well layer 12 is not etched. P-InGaP is used in the etch stop layer 14 in this embodiment.

As shown in FIG. 2, an n-GaAs current confinement layer 17 is selectively grown on both sides of the stripe region by MOVPE using the oxide film used as an etching mask as a selective growth mask area. Thereafter, a wafer is taken out from a growth furnace and the oxide film used as a selective growth mask is removed by etching. A p-GaAs contact layer 18 is then formed by MOVPE or MBE. After a p-side ohmic electrode 19 and an n-side ohmic electrode 20 are formed, they are cleaved in the air to obtain a laser element having a cavity length of about 600 $\mu$m.

To carry out a facet treatment according to the present invention, several laser elements are set on a jig (a sample holder) and introduced into a device for carrying out the facet treatment. Each element is heated at 300° C., and the facet is irradiated with an oxygen radical beam 6 and a hydrogen radical beam 8 as shown in FIG. 1. The oxygen radical is generated by introducing 5 sccm of oxygen into an RF radical cell for generating plasma by applying a high frequency (RF) of 13.56 MHz. The hydrogen radical is generated by thermal excitation by electron bombardment heating such that 200 mA of electrons are supplied from a filament installed near the side wall of a tungsten tube by applying a high voltage of 5 kV to the tungsten tube to heat the tungsten tube at 2,500° C. The discharge of hydrogen is 3 sccm.

Preferably, the oxygen radical irradiation time is 5 seconds, the hydrogen radical irradiation time is 3 seconds, and the oxygen radical and the hydrogen radical are irradiated 100 times alternately. Thereby, an interfacial layer 3 which has a thickness of 50 Å is formed, essentially composed of Ga oxide and not containing substantial amounts of As oxide.

A description will now be given of examples of a radical treatment device, radical irradiation and the change in the composition of a surface oxide. These examples may be generalized to many or all embodiments of the present invention.

Figure 4:
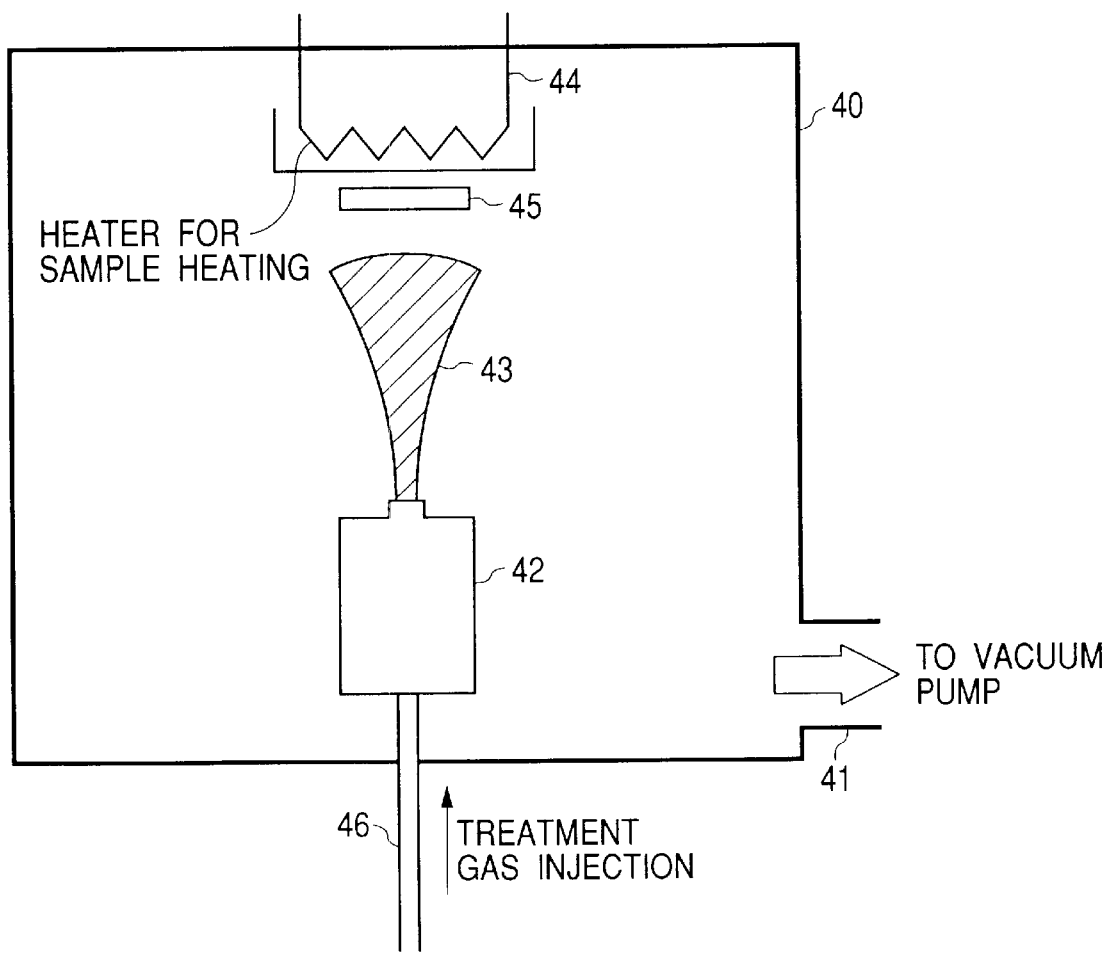
FIG. 4 is a conceptual diagram of a radical treatment device.

FIG. 4 is a conceptual diagram showing an example of a radical treatment device. A radical generator 42 is arranged in a vacuum container 40, and a sample base 45 and a sample heater 44 are arranged opposite to the generator 42. The vacuum container 40 is connected to a common vacuum pumping system 41 and to a gas injection system 46 for treatment. In the figure, reference numeral 43 denotes a radical beam and 45 represents a sample. Conditions required for the treatment will generally be satisfied if a common vacuum system and gas injection system are used.

Figure 5:
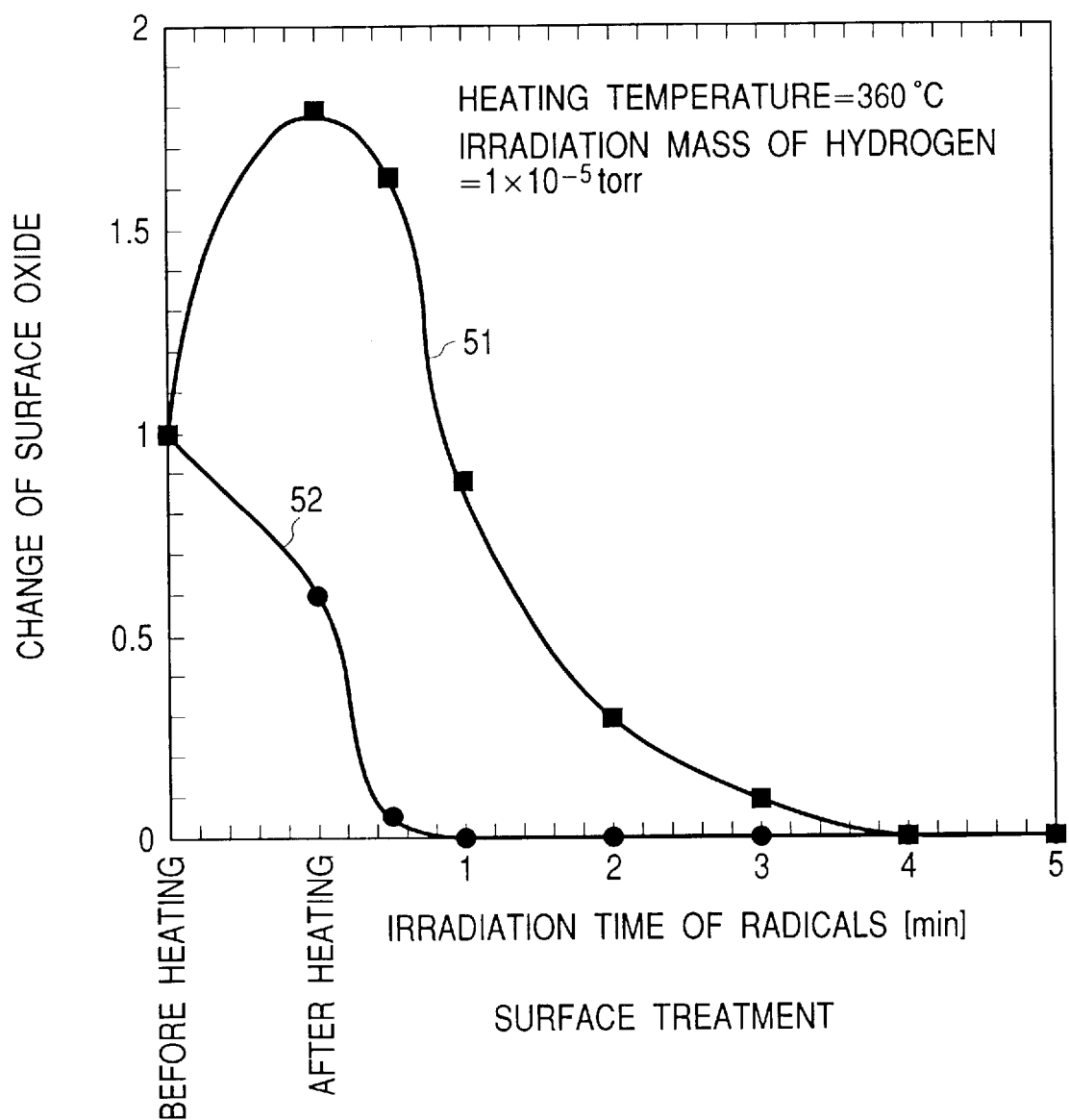
FIG. 5 is a diagram showing examples of radical irradiation and the change in the composition of a surface oxide.

FIG. 5 shows examples of radical irradiation and the change in the composition of the surface oxide. A state before heating is shown as 1 on the ordinate axis. The abscissa axis shows radical irradiation time, and the ordinate axes shows the amount of the residual surface oxide as a relative value. Conditions in this exemplary embodiment include a heating temperature of 300° C. and a hydrogen irradiation mass of $1 \times 10^{-5}$ torr. The curve 51 shows the amount of the residual Ga oxide and the curve 52 shows the amount of the residual As oxide.

The expression "after heating" on the abscissa axis indicates the point where only a heat treatment is carried out, before any radical treatment. That is, the state shown by the axis of abscissa is reached only by heating. Heat is applied from the point 1 on the ordinate axis until the point in time where the "after heating" label is met. After the heat is removed, when the radical is irradiated from this "after heating" state, the state is changed as shown by the curve 51 and the curve 52.

According to the FIG. 5 example, it is shown that the As oxide reaches a state of 0 by 1 minute of radical irradiation. At this point, the Ga oxide is in a state of approximately 0.9. Therefore, the surface of the semiconductor material is composed of Ga oxide in this state and is substantially free from Arsenic oxide. The present invention preferably makes use of this state.

A return to the steps of the present exemplary embodiment will now be described. By using a reactive sputtering method, as shown in FIG. 3, aluminum oxide ($Al_2O_3$) films having a cavity length (thickness) of $\lambda/4$ ($\lambda$: oscillation wavelength) are formed sequentially to form an anti-reflection (AR) film 21 on the front side (z=0) of the element and a high-reflection (HR) film 24 consisting of 10 layers (silicon oxide ($SiO_2$) layers 22 having a cavity length (thickness) of ¼ and silicon nitride (SiN) films 23 having an optical cavity (thickness) of ¼) is formed on the rear side (z=L) of the element. The SiN layer is formed in accordance with an ECR sputtering method by introducing 20 sccm of Ar gas and 8 sccm of nitrogen gas into a device and generating plasma at an electron cyclotron resonance (ECR) output of 500 W to apply an RF output of 500 W to a Si target. Thereafter, the element is bonded on a heat sink with a bonding surface facing up.

In this embodiment, oxygen and hydrogen radicals are irradiated alternately. The radiation time of these radicals is approximately between 1 and 30 seconds.

Testing of experimental specimens showed the manufactured elements oscillate continuously at room temperature at a threshold current of about 14 mA and have an oscillation wavelength of about 0.68 $\mu$m. The elements stably oscillate in a fundamental lateral mode at a threshold current of up to 150 mW. A maximum (peak) optical output of at least 300 mW was obtained. When 30 elements are operated continuously at a fixed threshold current of 50 mW and an environmental temperature of 80° C., the initial operating current is about 200 mA and all the elements operate stably for more than 50,000 hours without facet degradation.

In this embodiment, RF plasma excitation and electron beam bombardment heating are used to generate radicals. In the present invention, other radical formation methods such as microwave plasma enhanced excitation and helicon wave plasma enhanced excitation may also be used. Also in this example, oxygen and hydrogen radicals are irradiated alternately, but these radicals may be mixed together and irradiated simultaneously, or oxygen and hydrogen may be mixed together in a radical cell and excited to radicals. It is preferred to avoid the use of electron beam bombardment heating which uses a tungsten tube for the formation of the oxygen radical.

An example of an acceleration test will now be given. In a nitrogen dry atmosphere at 50° C., an acceleration test is carried out at a fixed optical output (i.e., using automatic power control). Operation current is controlled to obtain fixed optical output and a time when this operation current rises by at least 20% is recognized as the service life of the laser diode.

Figure 6:
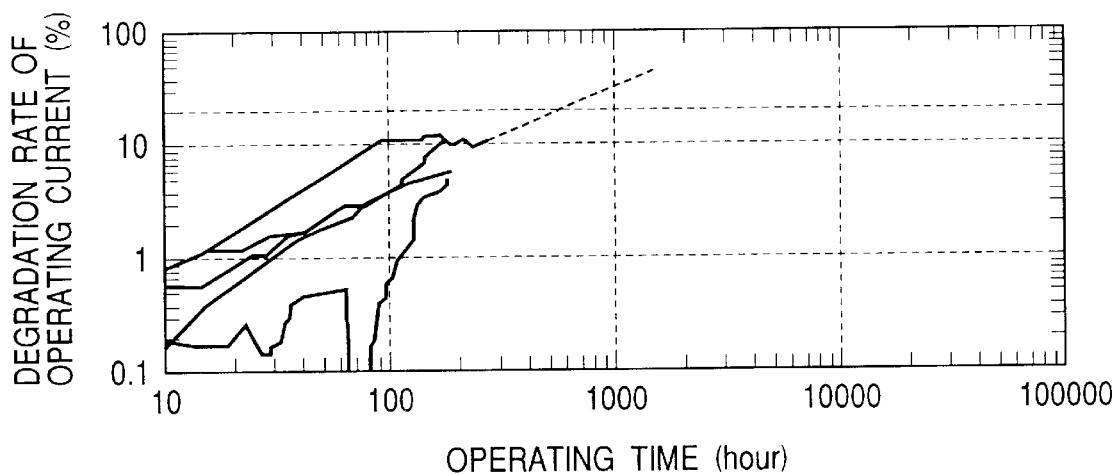
FIG. 6 is a diagram showing the results of a reliability test on a conventional laser diode.
Figure 7:
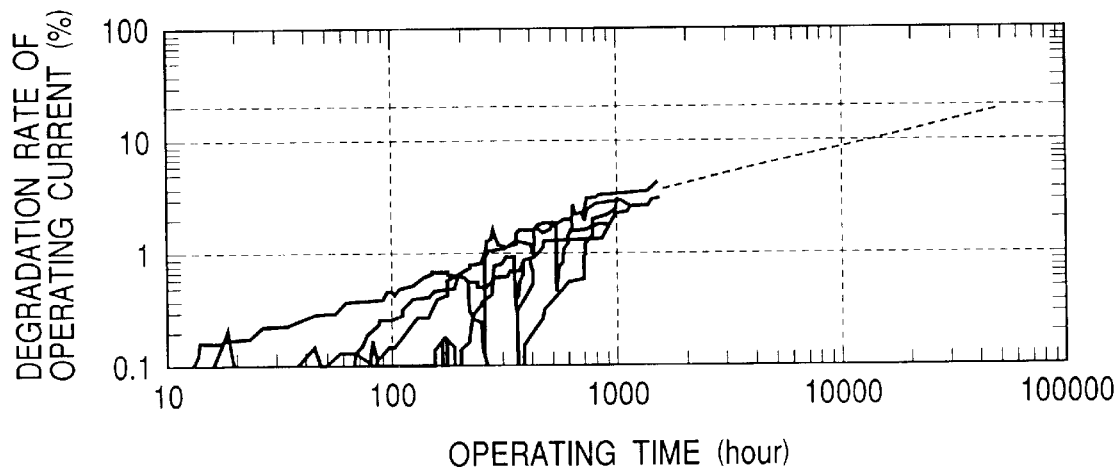
FIG. 7 is a diagram showing the results of a reliability test on a laser diode according to the present invention.

FIG. 6 shows the results of a reliability test on a laser diode which comprises a facet coating film of the prior art, and FIG. 7 shows the results of a reliability test on a laser diode which comprises a facet coating film according to the present invention. In these figures, the abscissa axes show operation time and the ordinate axes show the degradation rate of operating current. As understood from the test results of FIG. 6 and FIG. 7, in excess of a ten-fold improvement in the service life can be seen in the present invention when compared to the prior art.

An additional exemplary embodiment of the present invention will be described with reference to FIG. 1, FIG. 8 and FIG. 9. This examples details the application of the present invention to a 0.98 $\mu$m band high-output laser diode for exciting a rare earth doped optical fiber amplifier used in a repeater or receiver in an optical transmission system. FIG. 1 shows a surface treatment method for forming an interfacial layer on the facet according to the present invention (as discussed with previous embodiments). FIG. 9 is a plan view of a laser diode having a Fabry-Perot cavity, and FIG. 8 is a sectional view of the laser diode.

A description is first given of the method of producing the laser diode. The following layers are preferably formed on an n-GaAs substrate 9 sequentially: (1) a GaAs buffered layer 10; (2) GaAs lattice matched n-InGaP cladding layer 25; (3) strained quantum well active layer 26 consisting of an $In_{1-x}Ga_xAs_yP_{1-y}$ barrier layer (x=0.82, y=0.63, barrier layer thickness of 35 nm) and an $In_zGa_{1-z}As$ strained quantum well layer (z=0.16, well layer thickness of 7 nm); (4) GaAs lattice matched p-InGaP cladding layer 27; (5) p-GaAs optical guide layer 28; (6) GaAs lattice matched p-InGaP cladding layer 29; and (7) p-GaAs cap layer 30. Each layer may be formed using a common method in this field, such as MOVPE, gas source MBE or CBE.

A ridge (shown in FIG. 8) is then formed by photoetching using the oxide film as a mask area. This etching may be wet etching, RIE, RIBE, ion milling or similar processes. Etching is stopped at an intermediate position of the p-InGaP cladding layer 27 so that the p-GaAs optical guide layer 28 is completely removed and the strained quantum well layer 26 is not etched. The shape of the ridge in this embodiment differs from the shape of the ridge in the previous embodiments. Preferably, the shape is such that a middle portion in a thickness direction of the semiconductor layer 28 has a small width in a direction perpendicular to the traveling direction of light.

Figure 8:
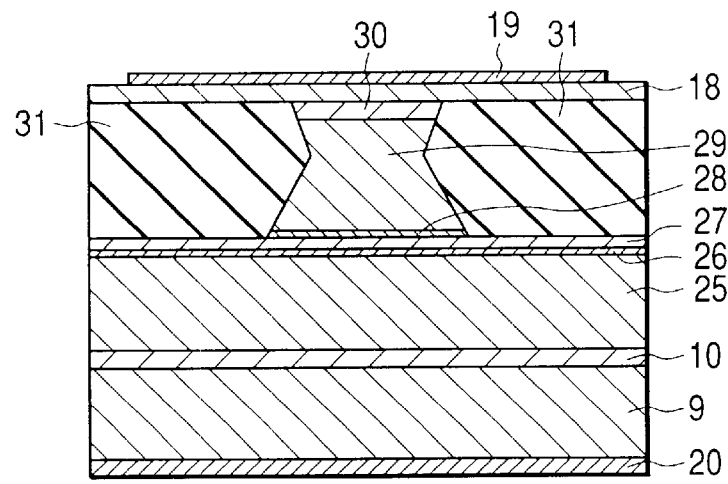
FIG. 8 is a sectional view in a direction perpendicular to the traveling direction of light of a laser diode according to a second exemplary embodiment of the present invention.
Figure 9:
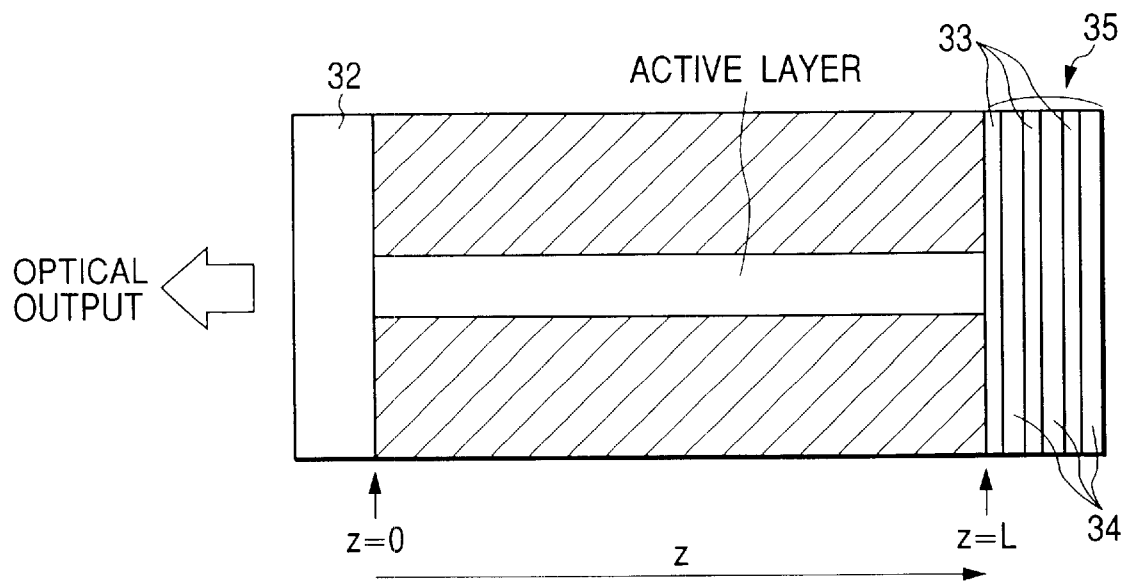
FIG. 9 is a plan view in a direction parallel to the traveling direction of light of the laser diode according to a second exemplary embodiment of the present invention.

Thereafter, as shown in FIG. 8, an n-InGaP current confinement layer 31 is selectively grown on both sides of the stripe region by MOVPE using the oxide film used as an etching mask as a selective growth mask area. The wafer is then taken out from the growth furnace and the oxide film used as a selective growth mask is removed by etching. Further, a p-GaAs contact layer 18 is formed by MOVPE or MBE. After a p-side ohmic electrode 19 and an n-side ohmic electrode 20 are formed, a laser element having a cavity length of about 900 $\mu$m is obtained by a cleavage method.

The method of carrying out a facet treatment according to the present invention will now be described. Some (of the multiple) laser elements prepared in the previous step are secured in a jig. The jig is introduced into a device having a vacuum container for carrying out a facet treatment to heat the laser elements at 300° C. Like the first exemplary embodiment, as shown in FIG. 1, the optical output facet of each laser element is irradiated with the oxygen radical beam 6 and the hydrogen radical beam 8.

The oxygen radical is preferably generated by introducing oxygen into an ECR radical cell for generating plasma by applying microwaves. The microwave frequency is approximately 2.45 GHz and the amount of oxygen is 20 sccm. The hydrogen radical is preferably generated by using a helicon wave radical cell for converting into helicon wave plasma by applying a magnetic field to radio frequency plasma. The magnetic field is preferably 50 Gauss. The discharge of hydrogen is 10 sccm. Generally speaking, the amount of hydrogen is in the range of 10 to 100 sccm and the amount of oxygen is in the range of 10 to 50 sccm in a preferred case.

In this embodiment, the oxygen radical and the hydrogen radical are irradiated for 10 minutes simultaneously. Thereby, an interfacial layer 3 is formed which has a thickness of 120 Å, is essentially composed of Ga oxide and is substantially free from As oxide. Thereafter, an anti-reflection film 32 which may be an aluminum nitride (AlN) thin film having a cavity length (thickness) of $\lambda/4$ ($\lambda$: oscillation wavelength) is formed on the front side (z=0) of the laser element and a high-reflection film 35 consisting of 6 layers (SiO$_2$ thin films 33 having a cavity length (thickness) of $\lambda/4$ and hydrogenated amorphous silicon (a-Si:H) films 34 having an optical cavity (thickness) of $\lambda/4$) is formed on the rear side (z=L) of the laser element by an ECR sputtering method.

Thereafter, the laser element is bonded on a heat sink with the bonding surface in the interior of the crystal facing down. An exemplary manufactured laser element oscillates continuously at room temperature at a threshold current of about 10 mA and its oscillation wavelength is about 0.98 $\mu$m. The element stably oscillates in a fundamental lateral mode at a threshold current of up to 780 mW. Even by increasing the optical output, facet degradation may not occur, and a maximum (peak) optical output of 900 mW is limited by thermal saturation. When 30 elements are operated continuously at a fixed optical output of 500 mW and an environmental temperature of 80° C., the initial operation current is about 400 mA and all the elements operate stably for more than 100,000 hours without facet degradation.

In this embodiment, the ECR radical cell and helicon wave radical cell are used to generate radicals for facet treatment. Other excitation such as thermal excitation, RF plasma enhanced excitation, grow discharge excitation or optical excitation using ultraviolet radiation may be used to generate radicals.

The active layer of the above embodiment may be used as a GRIN-SCH (Graded Index Separate Confinement Hetero structure) active layer whose SHC layer composition is changed stepwise.

Since the present invention preferably does not make use of a guide structure, BH (Buried Hetero Structure) may be used as a guide structure in addition to the guide structure of the above embodiment, or the structure of the present invention may be applied to a surface emission laser.

Figure 10:
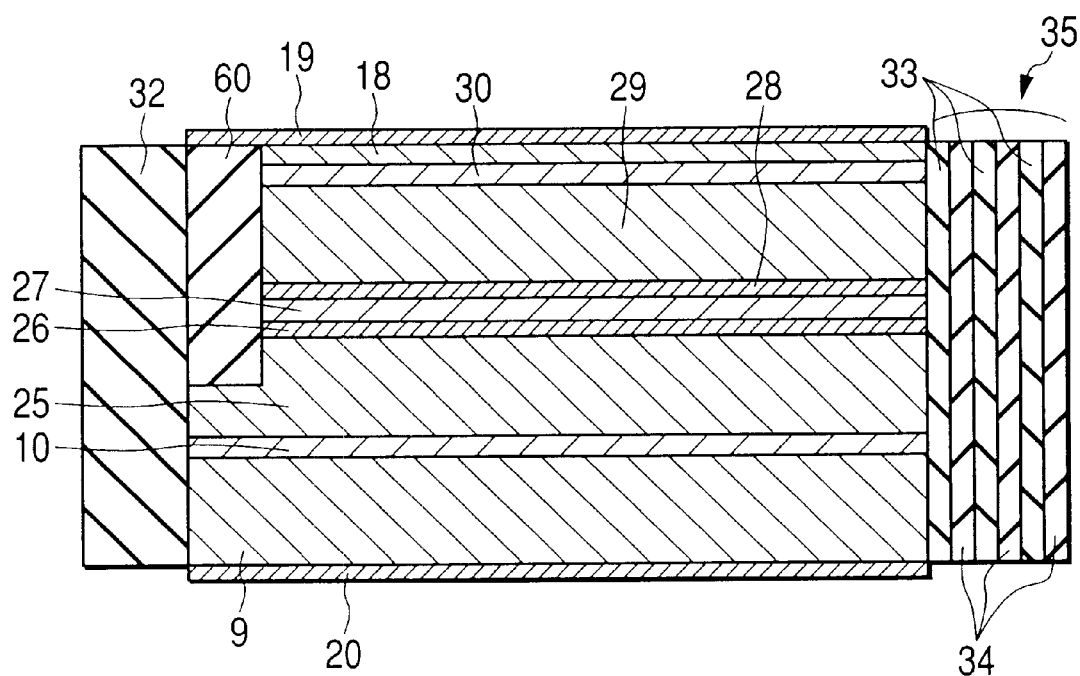
FIG. 10 is a sectional view in a direction parallel to the traveling direction of light of a laser diode of the present invention having a window structure.

The present invention can be applied to a laser diode having a so-called "window structure" in which the super lattice structure near the facet is made inoperable by thermally diffusing zinc atoms near the facet or by injecting silicon ions at a high speed. FIG. 10 is a sectional view in a direction parallel to the traveling direction of light of an example of the laser diode of the present invention having this window structure. Reference numeral 60 denotes a zinc diffusion region constituting the window region. Other regions are the same as those of FIG. 8.

Further, the present invention may be applied to laser diodes having oscillation wavelengths of 0.65 $\mu$m, 0.63 $\mu$m, or other wavelengths in addition to the above laser diodes having oscillation wavelengths of 0.98 $\mu$m and 0.68 $\mu$m.

After the facet treatment of the present intention is carried out, it may be desirable to form a facet coating film under vacuum. However, a facet coating film may also be formed using a different film formation device by carrying it through the air.

The laser diode of the present invention preferably has a higher yield and higher reliability and can be produced at a lower cost than the laser diode of the prior art. The present invention may also provide a laser diode with a long operational life and high-reliability. Further, it may provide a novel method of manufacturing a long-life and high-reliability laser diode.

Nothing in the above description is meant to limit the present invention to any specific materials, geometry, or orientation of elements. Many part/orientation substitutions are contemplated within the scope of the present invention and will be apparent to those skilled in the art. The embodiments described herein were presented by way of example only and should not be used to limit the scope of the invention.

Although the invention has been described in terms of particular embodiments in an application, one of ordinary skill in the art, in light of the teachings herein, can generate additional embodiments and modifications without departing from the spirit of, or exceeding the scope of, the claimed invention. Accordingly, it is understood that the drawings and the descriptions herein are proffered by way of example only to facilitate comprehension of the invention and should not be construed to limit the scope thereof.

What is claimed is:

1. A method of manufacturing a laser diode, comprising the steps of:

preparing an optical cavity having compound semiconductor crystals in the III–V family;

irradiating a radiation surface of the optical cavity with hydrogen and oxygen; and said optical cavity having a cleaved facet, Ga oxide and As oxide existing and containing on a surface of the cleaved facet and only the As oxide being reduced and separated from the surface by said irradiation.

2. The method of manufacturing a laser diode of claim 1, wherein the hydrogen and the oxygen are irradiated alternately.

3. The method of manufacturing a laser diode of claim 1, wherein the hydrogen and the oxygen are irradiated at the same time.

4. The method of manufacturing a laser diode of claim 1, wherein the hydrogen is excited to a state selected from the group consisting of atomic, radical, ion and mixed state of thereof, and wherein the oxygen is excited to a state selected from the group consisting of atomic, radical, ion, ozone and mixed state of thereof.

* * * * *